(12) United States Patent
Scilla

(10) Patent No.: US 9,153,578 B2
(45) Date of Patent: Oct. 6, 2015

(54) TRIMMING CIRCUIT FOR AN INTEGRATED CIRCUIT AND RELATED INTEGRATED DEVICE

(71) Applicant: STMicroelectronics S.r.l., Agrate Brianza (IT)

(72) Inventor: Giuseppe Scilla, Catania (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 14/153,616

(22) Filed: Jan. 13, 2014

(65) Prior Publication Data

US 2014/0197517 A1     Jul. 17, 2014

(30) Foreign Application Priority Data

Jan. 17, 2013 (IT) .............................. MI2013A0062

(51) Int. Cl.
| | |
|---|---|
| *H01L 21/82* | (2006.01) |
| *H01L 27/07* | (2006.01) |
| *H01L 21/8228* | (2006.01) |
| *H01L 23/525* | (2006.01) |
| *H01L 27/08* | (2006.01) |
| *H01C 17/22* | (2006.01) |

(52) U.S. Cl.
CPC ...... *H01L 27/0755* (2013.01); *H01L 21/82285* (2013.01); *H01L 23/5256* (2013.01); *H01L 27/0802* (2013.01); *H01C 17/22* (2013.01)

(58) Field of Classification Search
None
See application file for complete search history.

(56) References Cited

U.S. PATENT DOCUMENTS

| | | | | |
|---|---|---|---|---|
| 3,930,304 | A * | 1/1976 | Keller et al. ....................... | 438/6 |
| 5,459,684 | A * | 10/1995 | Nakamura et al. .............. | 365/149 |
| 5,675,174 | A * | 10/1997 | Nakajima et al. .............. | 257/529 |
| 5,991,219 | A * | 11/1999 | Nakashima ................ | 365/225.7 |
| 6,111,449 | A * | 8/2000 | Tobita ........................ | 327/327 |
| 6,452,478 | B1 | 9/2002 | Dale | |
| 7,205,880 | B2 * | 4/2007 | Fukunaga ...................... | 338/195 |
| 8,193,854 | B2 * | 6/2012 | Kuang et al. .................. | 327/539 |
| 2002/0003447 | A1* | 1/2002 | Nagase et al. ................ | 327/530 |
| 2008/0218248 | A1* | 9/2008 | Kim .............................. | 327/525 |
| 2012/0286848 | A1* | 11/2012 | Scilla et al. ................... | 327/525 |

FOREIGN PATENT DOCUMENTS

| | | |
|---|---|---|
| JP | 60043854 | 3/1985 |
| JP | 03038861 | 2/1991 |
| JP | 2000174211 | 6/2000 |

* cited by examiner

*Primary Examiner* — Benjamin Sandvik
*Assistant Examiner* — Herve Assouman
(74) *Attorney, Agent, or Firm* — Gardere Wynne Sewell LLP

(57) ABSTRACT

A trimming circuit is configured to carry out a trimming operation on a device portion of an integrated circuit device. The trimming circuit includes: shunt fuses wherein each shunt fuse is coupled in parallel to a trimming resistance, further resistances wherein each further resistance is coupled in parallel to a respective shunt fuse. The circuit is configured to allow the flow of the trimming current when the respective shunt fuse is burnt during the trimming operation.

11 Claims, 4 Drawing Sheets

TRIMMING CIRCUIT FOR AN INTEGRATED CIRCUIT AND RELATED INTEGRATED DEVICE

PRIORITY CLAIM

This application claims priority from Italian Application for Patent No. MI2013A000062 filed Jan. 17, 2013, the disclosure of which is incorporated by reference.

TECHNICAL FIELD

The present invention relates to a trimming circuit for an integrated circuit and related integrated circuit.

BACKGROUND

Following the technology evolution, the target of the current electronic products is the low voltage for low power and the restricted error tolerance for greater component accuracy. For example, the circuits used to generate the reference quantity (a voltage or a current) must have a very low tolerance to ensure the reference quantity to have a precise and stable value.

The problem of obtaining a very low tolerance is generally solved by providing trimming elements in the integrated device to connect to the circuit in order to correct an inaccuracy thereof. During the trimming process, the characteristic parameter of the circuit element is measured and compared with a nominal value thereof. The trimming elements are activated or deactivated according to the result of this comparison so as to obtain the required tolerance.

Moreover the market constraints imply to supply these components at lower price and smaller package but with a constant pin out.

So there is a need to improve the circuit architecture and the trimming techniques to increase the accuracy and the stability of these components over time and temperature. Today, conventional trimming is performed before packaging, on the wafer (EWS: Electrical Wafer Sort). In fact, the EWS test is performed on the wafer prior to severing the individual integrated circuit die destined to final packaging operations. This needs an additional step in the production cycle together with internal extra pads associated to the trimming elements.

Trimming may even need to be carried out at the packaged circuit device final testing stage. Indeed, the isolation resin injected into the mold exerts a pressure on the semiconductor chip that may cause mechanical stress/strain on the crystalline semiconductor capable of altering electrical parameters. For this reason, it may be necessary to carry out a trimming operation when the packaged circuit device is tested.

An example of a device requiring a trimming at the very late stage of the manufacturing process, that is after completion of the packaging of the integrated circuit device incorporating the device itself, is a band-gap regulator for producing a constant voltage reference insensitive to the working temperature.

The trimming elements may consist of the use of metal fuses. The circuit element is formed by several elemental components connected to each another, for example, in series. A trimming element in series with a metal fuse is connected in parallel with each elemental component. The terminals of each metal fuse are accessible from outside the integrated circuit by means of a couple of firing pads. If a current of high value is supplied to the firing pads, the metal fuse is blown; the corresponding trimming element is thus deactivated (since it is disconnected from the elemental component).

The trimming element may consist in the use of Zener diodes in the place of the metal fuses. If a current of high value is supplied to the firing pads, the Zener diode is blown and it is brought to a breakdown condition wherein it behaves as a short-circuit; the corresponding trimming element is thus activated (since it is connected to the elemental component).

In these solutions the firing pads take up a considerable amount of space on a semiconductor chip wherein the integrated circuit is formed. This leads to the need to limit the number of firing pads and hence trimming elements, correspondingly limiting the degree the accuracy which can be obtained.

The use of these solutions in an integrated circuit encapsulated in a package requires too great a number of external pins (connected to the firing pads) and metal connection tracks which are very wide in order to be able to withstand the current necessary to blow the metal fuses and the Zener diodes. The trimming process may not correct variations in the characteristic parameter of the circuit element caused by mechanical and thermal stresses undergone by the integrated circuit during encapsulation operation.

In view of the foregoing, there is a need to provide a trimming circuit for an integrated device having a reduced number of components and requiring no dedicated pin or only a dedicated pin.

SUMMARY

According to the present disclosure, the foregoing need is addressed by means of a trimming circuit configured to carry out a trimming operation on a device portion of an integrated circuit device. This circuit comprises: a plurality of shunt fuses, each shunt fuse of the plurality of shunt fuses being coupled in parallel to a trimming resistance of a plurality of trimming resistances, and a plurality of further resistances, each further resistance of the plurality of the further resistances being coupled in parallel to a respective shunt fuse of the plurality of shunt fuses and configured to allow the flow of the trimming current when the respective shunt fuse is burnt during the trimming operation.

Preferably the plurality of shunt fuses are coupled between a first and a second pin of the integrated device, Preferably the size of the shunt fuses of the plurality of shunt fuses increases from the first to the last of the plurality of shunt fuses.

BRIEF DESCRIPTION OF THE DRAWINGS

For a better understanding of the present invention, a preferred embodiment thereof is now described, purely by way of non-limiting example and with reference to the annexed drawings, wherein.

DETAILED DESCRIPTION OF THE DRAWINGS

Figure 1:
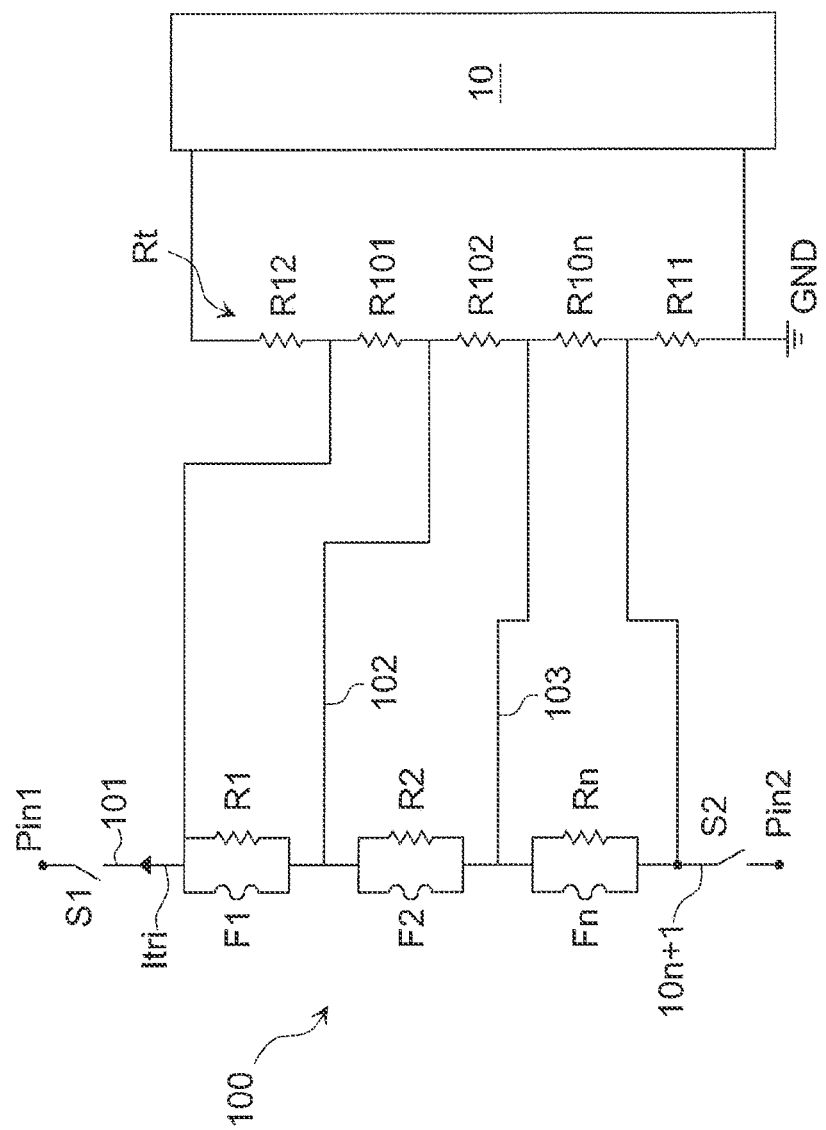
FIG. 1 is a schematic of a trimming circuit for an integrated device.

FIG. 1 shows a trimming circuit 100 for an integrated device. The trimming circuit 100 may be incorporated in each integrated device having portions that require trimming, for example, a voltage reference circuit.

The trimming circuit 100 comprises a plurality of fuses or shunt fuses F1, F2, . . . Fn each one connected in parallel to a respective resistance of a plurality of resistances R1, R2, . . . Rn.

The trimming circuit 100 has n+1 terminals 101, 102, . . . 10n+1 connected with the circuit portion 10 of the integrated device which requires trimming. The terminals 101, 102 . . . 10n+1 are connected with trimming resistances R101, R102, . . . R10n of the resistance Rt which is connected to the device portion 10 of the integrated circuit device. Typically the trimming resistances R101, R102, . . . R10n are portions of the body resistance of the integrated circuit device to be trimmed and are shorted unless the respective fuses F1, F2, . . . Fn are burnt.

Two terminals 101, 10n+1 are connectable with the pins Pin1, Pin2 of the integrated device. The terminals 101, 10n+1 of the trimming circuit 100 are directly connectable with the pins Pin1, Pin2 in the case wherein the pin Pin1 is a dedicated pin and the pin Pin2 is the ground pin; preferably the terminals 101, 10n+1 are connectable with the pins Pin1, Pin2 by means of switches S1 and S2 that are closed when a trimming operation occurs. In the last case the pins Pin1, Pin2 can be two pins of the same circuit 10 or a dedicated pin and the ground pin, that is the pin which is connected or must be connected to ground GND.

The trimming operation is carried out by means of a trimming current Itri flowing through the trimming circuit 100 from the pin Pin2 to the pin Pin1; the trimming current is send into the trimming circuit 100 from the pin Pin2 to the pin Pin1 after the activation of the switches S1 and S2. The resistances R1, R2, . . . Rn maintain the electrical connection between the pins Pin1, Pin2 for the flux of the trimming current when one or more of the fuses F1, F2, . . . Fn must be burnt.

According to the trimming operation and considering the resistance Rt, which without the trimming resistances is given by the series of the resistances R11 and R12, when only the first fuse F1 is burnt, the trimming current Itri flows through the resistance R1 and the fuses F2 . . . Fn and the resistance Rt comprises even the parallel of the resistances R101 and R1 arranged in series to the resistances R11 and R12. If another fuse F2 is burnt, the trimming current flows through the resistances R1, R2 and the fuses F3 . . . Fn and the parallel of the resistances R102 and R2 is added in series to the resistances R11, R12 and the parallel of the resistances R1 and R101, and so on.

The size of each fuse of the plurality of fuses F1, F2, . . . Fn increases from the first fuse F1 to the last fuse Fn of the plurality of fuses F1, F2, . . . Fn. In this way the trimming current value needs to burn the fuse F2 is higher than the trimming current value needs to burn the fuse F1, the trimming current value needs to burn the fuse F3 is higher than trimming current value needs to burn the fuse F2 and so on.

Figure 2:
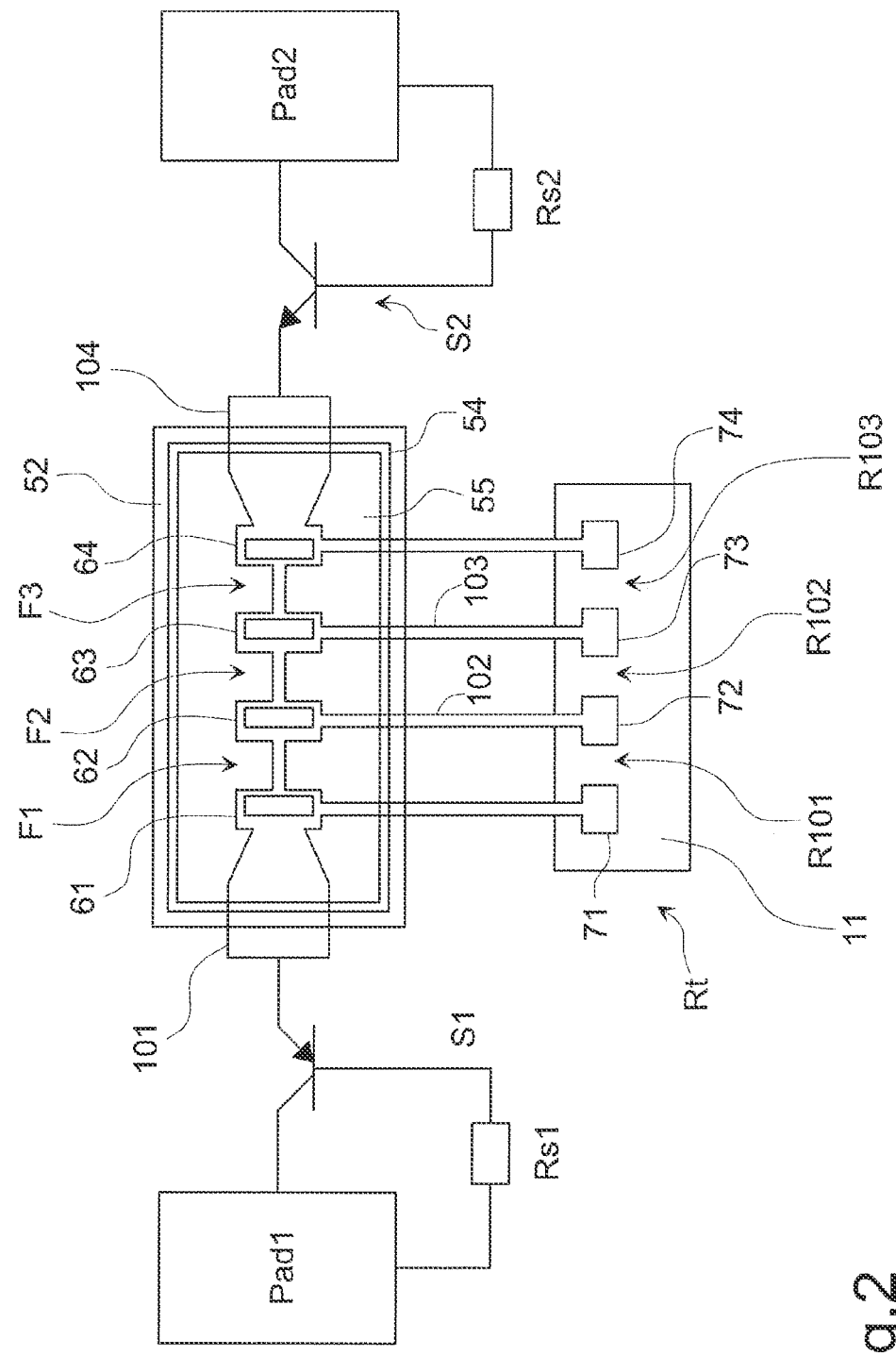
FIG. 2 shows schematically a layout of the trimming circuit in FIG. 1.
Figure 3:
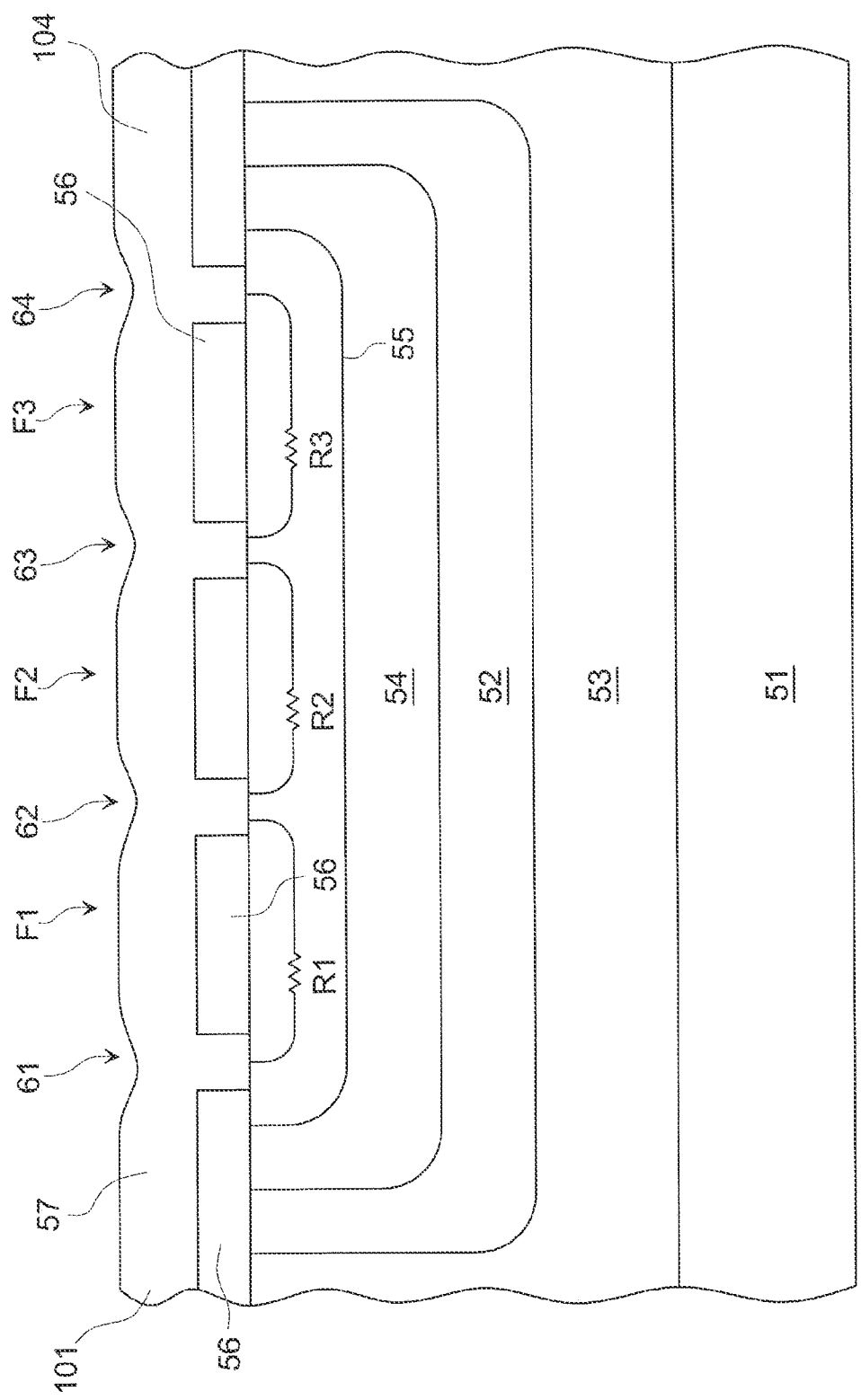
FIG. 3 is a cross sectional view of the layout of the trimming circuit in FIG. 2.

FIGS. 2 and 3 show the layout and a cross sectional view of an example of the implementation of the trimming circuit 100 in a semiconductor device; the trimming circuit 100 in FIGS. 2 and 3 comprises only the fuses F1-F3 and the resistances R1-R3, that is N=3. The semiconductor device comprises a substrate 51 of a first conductivity type, for example a p-type semiconductor substrate, over which an epitaxial layer 52 of a second conductivity type, for example a lightly-doped n-type semiconductor epitaxial layer, is grown. Preferably a buried layer 53 of the second conductivity type, for example a highly-doped n-type semiconductor buried layer, is formed on the substrate 51 so that the epitaxial layer 52 is grown on the buried layer 53. A well 54 of the first conductivity type is formed on the epitaxial layer 52 and a layer 55 of second conductivity type that is highly doped is formed on the well 54, for example a highly-doped n-type semiconductor layer. An insulating layer is selectively formed over the layer 55 so as to form a plurality of insulating layer regions 56, for example silicon oxide layer region, and zones 61-64 where no oxide is present; each insulating layer region 56 is placed between two adjacent zones of the zones 61-64. The plurality of insulating layer regions 56 is formed by depositing the insulating layer 56 over the layer 55 and then selectively removing the insulating layer to form the plurality of insulating layer regions and the plurality of contact zones 61-64.

A metal layer 57 is deposited over the insulating layer regions 56 and in the zones 61-64 so to form stopper and contact zones 61-64 for contacting the layer 55; in this way resistive paths R1-R3 inside the layer 55 and under the insulating layer regions 56 are formed and the fuses F1-F3 over the insulating layer regions 56 are formed. In fact, between two stopper and contact zones 61-62, 62-63 and 63-64 a respective resistive path R1, R2 and R3 is formed inside the layer 55 and under the insulating layer regions 56 and a respective fuse F1, F2 and F3 is formed by the portions of the metal layer 57 over the insulating layer regions 56 and between two stopper and contact zones 61-62, 62-63 and 63-64.

The stopper and contact zones 61-64 are connected with the respective contact zones 71-74 of the resistance Rt by means of metal paths 101-104; between two contact zones 71-72, 72-73 and 73-74 a respective resistive path R101, R102 and R103 is formed by means of a semiconductor body layer 11 as known in the state of the art.

Figure 4:
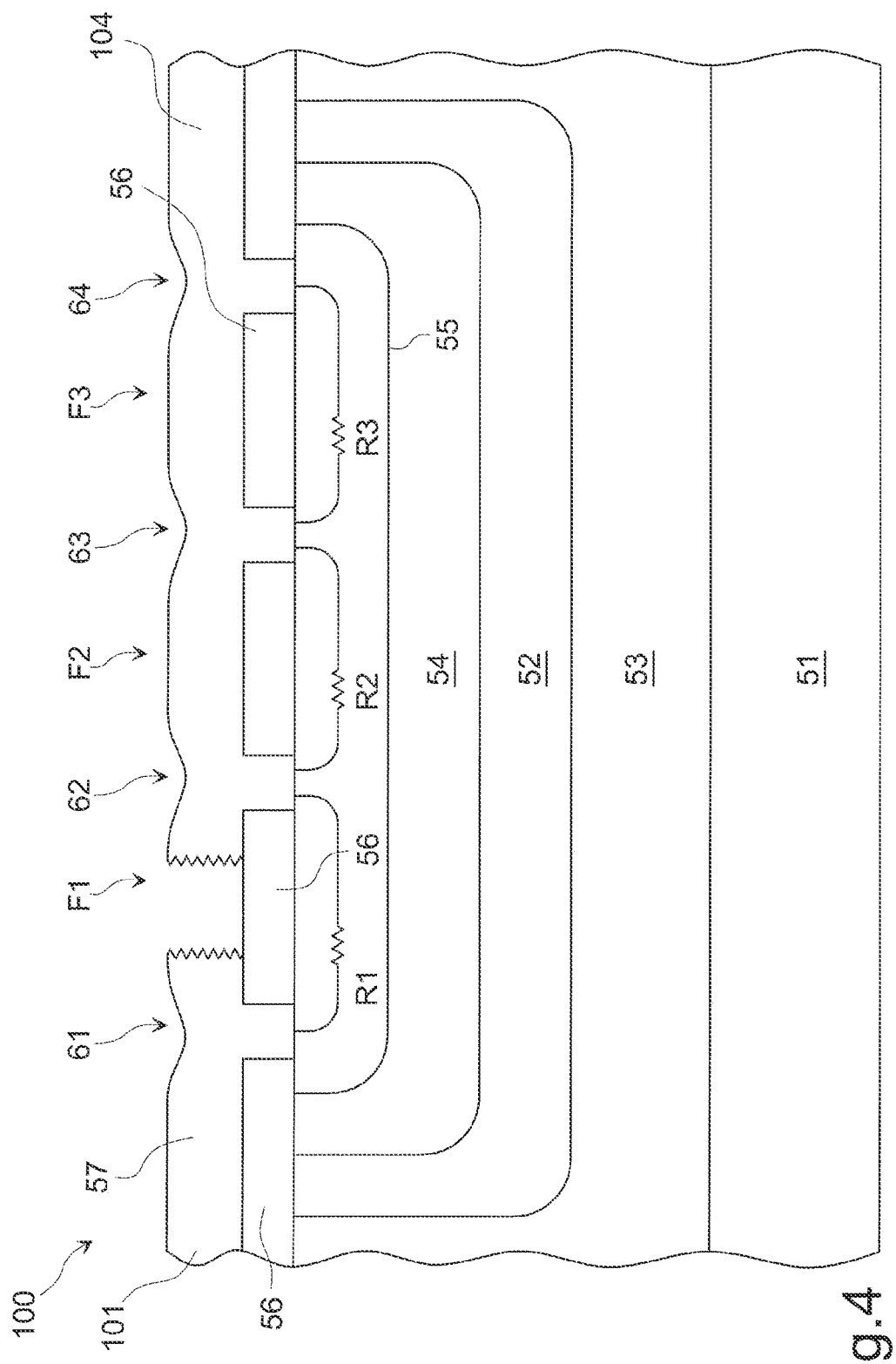
FIG. 4 is a cross sectional view of the layout of the trimming circuit in FIG. 2 in trimming operation.

The stopper and contact zones 61, 64 are respectively connected with the terminals 101, 104 of the trimming circuit 100 which are respectively connectable with the pad Pad1, Pad2 in turn connected with the pin Pin1, Pin2 not shown in FIGS. 2-4. Preferably the terminal 101, 104 of the trimming circuit 100 are respectively coupled with the pad Pad1, Pad2 by means of the switch S1 and S2 which, preferably are constituted of two bipolar transistor, a pnp transistor for the switch S1 and an npn transistor for the switch S2. Between the base and emitter terminals of the transistors S1 and S2 are arranged two resistances Rs1 and Rs2 of an opportune value such that, when the trimming circuit 100 must be operative, a higher potential is applied at the pin Pin2 connected with the pad Pad2 so as turn on the switches S1 and S2; therefore, even if the pin Pin2 is generally to ground GND, for activating the trimming circuit 100 a higher potential than the potential of the pin Pin1 must be applied at the pin Pin2.

Typically, in the integrated device the semiconductor substrate is connected to ground GND by means of a dedicated pin; in the case wherein the pin connected to ground GND is the pin Pin2, in trimming operation, the potential of the pin Pin2 is brought at a potential higher than the potential of the pin Pin1 and in this way even the potential of the semiconductor substrate 51 is brought a the higher potential. This causes the formation of direct polarized junction diodes between the substrate 51 and the epitaxial layer 52. For this reason the trimming circuit is implemented by the formation of the p-type well 54 configured to insulate the layer 55 so that it form an inverse polarized diode between the well 54 and the epitaxial layer 52 which prevents the flow of the current deriving from the epitaxial layer 52.

FIG. 4 shows the trimming circuit 100 in operation; a trimming current normally flows through the metal fuses F1-F3 of the trimming circuit 100, but if the value of the trimming current is such as to burn the first fuse F1, the trimming current will flow through the resistance R1 and the fuses F1 and F2. If the value of the trimming current is such as to burn even the second fuse F2, the trimming current will flow through the resistances R1 and R2 and the fuse F3 while if the value of the trimming current is such as to burn even the third fuse F3, the trimming current will flow only through the resistances R1-R3.

The trimming circuit 100 is particularly advantageous because it may be manufactured without implementing additional process steps and without the necessity of dedicated pins or only with one dedicated pin. The trimming circuit 100 allows trimming any circuit device, even after the packaging stage, with a great accuracy and with results that are stable during the functioning life of the circuit device. Moreover the trimming circuit 100 uses low-cost components and does not need any dedicated logic circuitry that cause a relevant silicon area consumption.

What is claimed is:

1. A trimming circuit configured to carry out a trimming operation on a device portion of an integrated circuit device including an externally accessible first pin and second pin, comprising:
    a plurality of shunt fuses directly connected in series with each other and coupled between the first pin and the second pin, each shunt fuse of the plurality of shunt fuses being coupled in parallel to a trimming resistance of a plurality of trimming resistances, and each shunt fuse configured to be selectively burnt in response to a different level of trimming current applied to one of the first pin and second pins, said trimming current flowing through the series connected shunt fuses between the first and second pins, and
    a plurality of further resistances, each further resistance of the plurality of the further resistances being coupled in parallel to a respective shunt fuse of the plurality of shunt fuses and configured to allow the flow of the trimming current when the respective shunt fuse is burnt during the trimming operation.

2. The trimming circuit according to claim 1, wherein said first pin is configured to receive a potential higher than the second pin during the trimming operation.

3. The trimming circuit according to claim 2, wherein the first pin is the ground pin of the integrated circuit device and the second pin is a dedicated pin.

4. The trimming circuit according to claim 2, wherein the trimming circuit is connected to the first pin and the second pin of the integrated circuit device by two respective switches, said switches being normally in off state and being configured to be on during the trimming operation.

5. The trimming circuit according to claim 4, wherein the switches configured to connect the trimming circuit with the first pin and the second pin of the integrated circuit device are respectively an npn bipolar transistor and a pnp bipolar transistor.

6. The trimming circuit of claim 1, wherein said trimming circuit is a circuit part of an integrated circuit device.

7. A semiconductor device including an externally accessible first pin and second pin, comprising:
    a trimming circuit formed in a semiconductor substrate of a first conductivity type, said trimming circuit comprising:
        a plurality of shunt fuses directly connected in series with each other and coupled between the first pin and the second pin, each shunt fuse of the plurality of shunt fuses being coupled in parallel to a trimming resistance of a plurality of trimming resistances, and each shunt fuse configured to be selectively burnt in response to a different level of trimming current applied to one of the first pin and second pins, said trimming current flowing through the series connected shunt fuses between the first and second pins, and
        a plurality of further resistances, each further resistance of the plurality of the further resistances being coupled in parallel to a respective shunt fuse of the plurality of shunt fuses and configured to allow the flow of the trimming current when the respective shunt fuse is burnt during the trimming operation;
    wherein said pluralities of shunt fuses and further resistances are formed of:
        a highly-doped layer of a second conductivity type placed over said substrate,
        a first insulating layer placed selectively over said highly-doped layer of the second conductivity type to form a plurality of regions of insulating layer and a plurality of contact zones wherein no insulating layer is present so that each region of insulating layer is comprised between two adjacent contact zones, and
        a metal layer placed over said first insulating layer and in the contact zones to contact the highly-doped layer of a second conductivity type so that the plurality of further resistances are formed by contiguous portions of said highly-doped layer of the second conductivity type, each individual portion extending between two adjacent contact zones and under the region of the insulating layer comprised between said two adjacent contact zones and the respective shunt fuse of the plurality of shunt fuses is formed of the portion of said metal layer placed over said region of the insulating layer comprised between said two adjacent contact zones.

8. The semiconductor device according to claim 7, wherein an epitaxial layer of the second conductivity type is grown on the substrate, a well of the first conductivity type is formed in the epitaxial layer and the highly-doped layer of the second conductivity type is formed in the well of the first conductivity type.

9. The semiconductor device according to claim 7, wherein said semiconductor device comprises a plurality of metal paths departing from said plurality of contact zones toward a respective further plurality of contact zones of the respective plurality of trimming resistances.

10. The semiconductor device according to claim 7, wherein said first pin is configured to receive a potential higher than the second pin during the trimming operation.

11. A method for manufacturing a semiconductor device on a semiconductor substrate of a first conductivity type, comprising: growing an epitaxial layer of a second conductivity type on the semiconductor substrate, said epitaxial layer including a buried layer of the second conductivity type that is more highly doped than said epitaxial layer; forming a well of the first conductivity type in the epitaxial layer; forming a highly-doped layer of the second conductivity type within the well; forming an insulating layer over the highly-doped layer of the second conductivity type, selectively removing the insulating layer to form a plurality of insulating layer regions and a plurality of contact zones wherein no insulating layer is present so that each region of insulating layer is comprised between two adjacent contact zones, forming a first metal layer over the insulating layer and in the contact zones to contact the highly-doped layer of the second conductivity type so as to form: a resistance comprising a portion of said highly-doped layer of the second conductivity type between two adjacent contact zones and under the region of the insulating layer comprised between said two adjacent contact zones and a shunt fuse formed of the portion of said metal layer placed over said region of the insulating layer between said two adjacent contact zones and connected in parallel with said resistance.

\* \* \* \* \*